US010446714B2

United States Patent
Fujii et al.

(10) Patent No.: US 10,446,714 B2
(45) Date of Patent: *Oct. 15, 2019

(54) HIGHLY EFFICIENT GALLIUM NITRIDE BASED LIGHT EMITTING DIODES VIA SURFACE ROUGHENING

(71) Applicants: Tetsuo Fujii, Goleta, CA (US); Yan Gao, Durham, NC (US); Evelyn L. Hu, Cambridge, MA (US); Shuji Nakamura, Santa Barbara, CA (US)

(72) Inventors: Tetsuo Fujii, Goleta, CA (US); Yan Gao, Durham, NC (US); Evelyn L. Hu, Cambridge, MA (US); Shuji Nakamura, Santa Barbara, CA (US)

(73) Assignees: THE REGENTS OF THE UNIVERSITY OF CALIFORNIA, Oakland, CA (US); JAPAN SCIENCE AND TECHNOLOGY AGENCY, Saitama Prefecture (JP)

( * ) Notice: Subject to any disclaimer, the term of this patent is extended or adjusted under 35 U.S.C. 154(b) by 76 days.

This patent is subject to a terminal disclaimer.

(21) Appl. No.: 14/281,535

(22) Filed: May 19, 2014

(65) Prior Publication Data

US 2014/0252396 A1    Sep. 11, 2014

Related U.S. Application Data

(63) Continuation of application No. 12/576,122, filed on Oct. 8, 2009, now Pat. No. 8,766,296, which is a
(Continued)

(51) Int. Cl.
*H01L 33/22* (2010.01)
*H01L 33/60* (2010.01)
(Continued)

(52) U.S. Cl.
CPC ............ *H01L 33/22* (2013.01); *H01L 33/007* (2013.01); *H01L 33/0079* (2013.01);
(Continued)

(58) Field of Classification Search
CPC ..... H01L 33/007; H01L 33/08; H01L 33/145; H01L 33/22; H01L 33/00; H01L 33/06; H01L 33/50; H01L 33/54
See application file for complete search history.

(56) References Cited

U.S. PATENT DOCUMENTS

| 3,739,217 A | 6/1973 | Bergh et al. |
| 5,773,369 A | 6/1998 | Hu et al. |

(Continued)

FOREIGN PATENT DOCUMENTS

| EP | 1271665 | 1/2003 |
| EP | 1296362 | 3/2003 |

(Continued)

OTHER PUBLICATIONS

Palacios et al., Wet etching og GaN grown by molecular beam epitaxy on Si(111), Aug. 17, 2000, pp. 996-999.*
(Continued)

*Primary Examiner* — Mohsen Ahmadi
(74) *Attorney, Agent, or Firm* — Gates & Cooper LLP

(57) ABSTRACT

A gallium nitride (GaN) based light emitting diode (LED), wherein light is extracted through a nitrogen face (N-face) of the LED and a surface of the N-face is roughened into one or more hexagonal shaped cones. The roughened surface reduces light reflections occurring repeatedly inside the LED, and thus extracts more light out of the LED. The surface of the N-face is roughened by an anisotropic etching, which may comprise a dry etching or a photo-enhanced chemical (PEC) etching.

12 Claims, 10 Drawing Sheets

Related U.S. Application Data continuation of application No. 10/581,940, filed as application No. PCT/US03/39211 on Dec. 9, 2003.

(51) Int. Cl.
    H01L 33/00    (2010.01)
    H01L 33/32    (2010.01)
    H01L 33/54    (2010.01)
    H01L 33/50    (2010.01)
    H01L 33/06    (2010.01)

(52) U.S. Cl.
    CPC .............. H01L 33/32 (2013.01); H01L 33/60
    (2013.01); H01L 33/00 (2013.01); H01L 33/06
    (2013.01); H01L 33/50 (2013.01); H01L 33/54
    (2013.01); H01L 2224/16225 (2013.01)

(56) References Cited

U.S. PATENT DOCUMENTS

| | | | |
|---|---|---|---|
| 5,779,924 | A | 7/1998 | Krames et al. |
| 5,780,873 | A | 7/1998 | Itaya et al. |
| 5,895,223 | A | 4/1999 | Peng et al. |
| 6,169,294 | B1* | 1/2001 | Biing-Jye et al. ............... 257/79 |
| 6,229,834 | B1* | 5/2001 | Nisitani et al. ............ 372/45.01 |
| 6,277,665 | B1 | 8/2001 | Ma et al. |
| 6,294,475 | B1 | 9/2001 | Schubert et al. |
| 6,441,403 | B1* | 8/2002 | Chang et al. ................... 257/94 |
| 6,514,782 | B1 | 2/2003 | Wierer, Jr. et al. |
| 6,657,236 | B1 | 12/2003 | Thibeault et al. |
| 6,744,071 | B2 | 6/2004 | Sano et al. |
| 6,847,057 | B1 | 1/2005 | Gardner et al. |
| 6,878,563 | B2 | 4/2005 | Bader et al. |
| 6,884,740 | B2 | 4/2005 | Hu et al. |
| 7,098,589 | B2 | 8/2006 | Erchak et al. |
| 7,135,709 | B1 | 11/2006 | Wirth et al. |
| 7,190,004 | B2 | 3/2007 | Nagai et al. |
| 2002/0190260 | A1 | 12/2002 | Shen et al. |
| 2003/0057444 | A1 | 3/2003 | Niki et al. |
| 2003/0141506 | A1 | 7/2003 | Sano et al. |
| 2003/0178626 | A1 | 9/2003 | Sugiyama et al. |
| 2003/0213964 | A1* | 11/2003 | Flynn ...................... C30B 23/00 257/85 |
| 2003/0222263 | A1 | 12/2003 | Choi |
| 2004/0012032 | A1* | 1/2004 | Toda ...................... B82Y 20/00 257/103 |
| 2004/0051109 | A1 | 3/2004 | Ishizaki et al. |
| 2004/0061433 | A1 | 4/2004 | Izuno et al. |
| 2004/0113167 | A1 | 6/2004 | Bader et al. |
| 2005/0082545 | A1 | 4/2005 | Wierer et al. |
| 2005/0205884 | A1 | 9/2005 | Kim et al. |
| 2006/0011935 | A1 | 1/2006 | Krames et al. |
| 2006/0163601 | A1 | 7/2006 | Harle et al. |
| 2006/0202226 | A1 | 9/2006 | Weisbuch et al. |

FOREIGN PATENT DOCUMENTS

| | | |
|---|---|---|
| EP | 1329961 | 7/2003 |
| EP | 1437776 | 7/2004 |
| EP | 1471583 | 10/2004 |
| EP | 1538680 | 6/2005 |
| JP | 06-177432 | 6/1994 |
| JP | 098403 | 1/1997 |
| JP | 10-233385 | 2/1998 |
| JP | 2002170993 | 6/2002 |
| JP | 2003-174191 | 6/2003 |
| JP | 2003-183100 | 7/2003 |
| JP | 2003218383 | 7/2003 |
| JP | 2003-277195 | 10/2003 |
| JP | 2003-532298 | 10/2003 |
| JP | 2003332618 | 11/2003 |
| JP | 2005191530 | 7/2005 |
| JP | 2007521641 | 8/2007 |
| WO | 0141219 | 6/2001 |
| WO | WO 01/41225 | 6/2001 |
| WO | 2003/034508 | 4/2003 |
| WO | 03065464 | 8/2003 |
| WO | WO2005/064666 | 7/2005 |

OTHER PUBLICATIONS

Chinese Office Action dated Jan. 5, 2012 for Chinese application No. 200910142642.4.
Japanese Office Action (Decision of Refusal) with translation dated Apr. 24, 2012 for Japanese Patent Application No. 2005-512858.
Tripathy et al., "Characterization of inductively coupled plasma etched surface of GaN using Cl2/BCl3 Chemistry:"; J. Vac. Sci. Technol. A, vol. 19, No. 5, Sep./Oct. 2001.
Japanese Office Action dated Oct. 20, 2009 for Japanese Patent Application No. 2005-512858 filed on Dec. 9, 2003.
Japanese Office Action (with English translation) dated Nov. 12, 2013 for Japanese Patent Application No. 2005-512858.
Japanese Office Action dated Aug. 31, 2010, Patent Application No. 2005-512858.
Ng, H. et al., "GaN nanotip pyramids formed by anisotropic etching," Journal of Applied Physics, vol. 94, No. 1, Jul. 1, 2003, pp. 650-653.
Chinese Office Action (Notification of the Decision of Rejection) with translation dated Aug. 3, 2012 for Chinese Patent Application No. 2009-10142642.4.
Japanese Office Action dated Feb. 12, 2013, Application No. 2005-512858 with English translation.
Taguchi, Tsunemasa, The technique for improving white LED lighting system with high-intensity, high-efficiency and long-life, Japan, Technical Information Institute Co., Ltd, Mar. 27, 2003, p. 19, with English translation.
Benisty, H. et al., "Impact of Planar Microcavity Effects on Light Extraction—Part I: Basic Concepts and Analytical Trends," IEEE Journal of Quantum Electronics, 34(9), pp. 1612-1631 (1998).
Billeb, A. et al., "Microcavity effects in GaN epitaxial films and in Ag/GaN/sapphire structures," Appl. Phys. Lett. 70(21), pp. 2790-2792 (1997).
Boroditsky, M. et al., "Light-Emitting Diode Extraction Efficiency," SPIE 3002, pp. 119-122 (1995).
Cao, X.A. et al., "Electrical effects of plasma damage in p-GaN," Appl. Phys. Lett. 75(17), pp. 2569-2571 (1999).
Chu, C.-F. et al., "Comparison of p-Side Down and p-Side Up GaN Light-Emitting Diodes Fabricated by Laser Lift-Off," Jpn. J. Appl. Phys. 42 (Part 2, No. 2B), pp. L147-L150 (2003).
Delbeke, D. et al., "High-Efficiency Semiconductor Resonant-Cavity Light-Emitting Diodes: A Review," IEEE Journal on Selected Topics in Quantum Electronics, 8(2), pp. 189-206 (2002).
Guo, X. et al., "Photon Recycling Semiconductor Light Emitting Diode," IEEE, pp. 23.6.1-23.6.4 (1999).
Harle, V. et al., "Advanced Technologies for high efficiency GaInN LEDs for solid state lighting," Proc. of SPIE 5187, pp. 34-40 (2004).
Huh, C. et al., "Improved light-output and electrical performance of InGaN-based light emitting diode by microroughening of the p-GaN surface," J. of Appl. Phys. 93(11), pp. 9383-9385 (2003).
Kawakami, Y. et al., "Dimensionality of Excitons in InGaN-Based Light Emitting Diodes," Phys. Stat. Sol. (a) 178, 331, pp. 331-336 (2000).
Minsky, M.S. et al., "Room-temperature photoenhanced wet etching of GaN," Appl. Phys. Lett. 68(11), pp. 1531-1533 (1996).
Ohba, Y. et al., "A study on strong memory effects for Mg doping in GaN metalorganic chemical vapor deposition," J. of Crystal Growth 145, pp. 214-218 (1994).
Nishida, T. et al., "Efficient and high-power AlGaN-based ultraviolet light-emitting diode grown on bulk GaN," Appl. Phys. Lett. 79(6), pp. 711-712 (2001).
CN Office Action with translation dated Sep. 26, 2010 (Appln. No. 200910142642.4).
European Search Report dated Aug. 5, 2011, Application No. 11154566.1.
Liu, L., et al., "Substrates for gallium nitride epitaxy", Materials Science and Engineernig R: Reports, Elsevier Sequoia S.A., Lausanne, CH, vol. 37, No. 3, Apr. 30, 2002, pp. 61-127, XP004349792.

(56) References Cited

OTHER PUBLICATIONS

Song, In Jae, "Properties of Etched Ga- and N-Faces of Freestanding GaN Substrate Using Inductively Coupled Plasma-Reactive Ion Etching", Japanese Journal of Applied Physics, vol. 41, No. 3B, Mar. 15, 2002, pp. L317-L319, XP001186604.
Weimann et al., "GaN nanotip pyramids formed by anisotropic etching", Journal of Applied Physics, vol. 94, No. 1, Jul. 2003.
JP Office Action dated May 28, 2013 with English machine translation.
US 6,648,882, Oct. 22, 2002, Motoki, et al. (withdrawn).
EP Search Report dated Mar. 20, 2008 for European Patent Application 03819251.4.
Dorogan et al., "Photoelectrochemical etching of GaN—AlGaN heterostructures formed on sapphire substrates," Moldavian Journal of the Physical Sciences, N2, 2002, pp. 156-159.
Fujii et al., "Increase in the extraction efficiency of GaN-based light-emitting diodes via surface roughening," Applied Physics Letters, vol. 84, No. 6, Feb. 9, 2004, pp. 855-857.
Hwang et al., "Efficient wet etching of GaN and p-GaN assisted with chopped UV source," Superlattices and Microstructures 35, 2004, pp. 45-57.
Schnitzer et al., "30% external quantum efficiency from surface textured, thin-film light-emitting diodes," Appl. Phys. Lett. 63 (16), Oct. 18, 1993, pp. 2174-2176.
Yamada et al., "InGaN-based near-ultraviolet and blue-light-emitting diodes with high external quantum efficiency using a patterned sapphire substrate and a mesh electrode," Jpn. J. Appl. Phys., vol. 41, 2002, pp. L1431-L1433.
Qi et al., "Study on the formation of dodecagonal pyramid on nitrogen polar GaN surface etched by hot $H_3PO_4$," Applied Physics Letters, 95, 2009, pp. 071114-1-071114-3.
Shchekin et al., "High performance thin-film flip-chip InGaN—GaN light-emitting diodes," Applied Physics Letters 89, 2006, 071109-1-071109-3.
Palacios, T. et al., "Wet Etching of GaN Grown by Molecular Beam Epitaxy on SI (111)", Semiconductor Science and Technology, IOP, Bristol, GB, vol. 15, No. 10, Oct. 2000, pp. 96-1000, XP000976071.
Ng, Hock M. et al., "Patterning GaN Microstructures by Polarity-Selective Chemical Etching", Japanese Journal of Applied Physics, Japan Society of Applied Physics, Tokyo, JP, vol. 42, No. 12A, Part 2, Dec. 1, 2003, pp. L1405-L1407, XP001186585.
Krames et al., "Status and Future of High-Power Light-Emitting Diodes for Solid State Lighting". Journal of Display Technology, vol. 3, No. 2, Jun. 2007, pp. 160-175.
Lin et al., "Blue light-emitting diodes with a roughened backside fabricated by wet etching". Applied Physics Letters 95, 2009, pp. 201102-1-201102-3.
Morita et al., "Watt-Class High-Output-Power 365 nm Ultraviolet Light-Emotting Diodes". Japanese Journal of Applied Physics, vol. 43, No. 9A, 2004, pp. 5945-5950.
Stonas et al., "Backside-illuminated photoelectrochemical etching for the fabrication of deeply undercut GaN structures". Applied Physics Letters, vol. 77, No. 16, Oct. 16, 2000, pp. 2610-2612.
Compound Semiconductor: Connecting the Compound Semiconductor Community, Mar. 2007, vol. 12, No. 2, pp. Cover page, 1, and 14-16.
Nezu, Tadashi, "Panasonic to Launch White LED Using GaN Substrate for 'First Time in Industry'". Tech-On!, Mar. 6, 2007, pp. 1-2.
Rattier et al., "Omnidirectional and compact guided light extraction from Archimedean photonic lattics". Applied Physics Letters, vol. 83, No. 7, Aug. 18, 2003, pp. 1283-1285.
Rattier et al., "Toward Ultrahigh-Efficiency Aluminum Oxide Microcavity Light-Emitting Diodes: Guided Mode Extraction by Photonic Crystals". IEEE Journal on Selected Topics in Quatum Electronics, vol. 8, No. 2, Mar./Apr. 2002, pp. 238-247.
Quality by Design: SemiLEDs. 2009, pp. 1-4. http://www.semileds.com/Quality_by_Design_SemiLEDs.htm.
EP Office Action dated Apr. 12, 2011, Patent Application No. 11154566.1.
CN Office Action dated May 18, 2011, Patent Application No. 200910142642.4.
CN Office Action dated Aug. 15, 2008, Patent Application No. 200380110945.9.
KR Office Action dated Aug. 27, 2010, Patent Application No. 10-2006-7013748.
KR Office Action dated May 11, 2011, Patent Application No. 10-2011-7004218.
CN Office Action dated Dec. 14, 2007, Patent Application No. 200380110945.9.
EP Office Action dated Mar. 20, 2009, Patent Application No. 03819251.4.
CN Office Action dated Mar. 29, 2010, Patent Application No. 200910142642.4.
Stocker, D.A., "Crystallographic wet chemical etching of GaN," Appl. Phys. Lett. 1998, 73(18):2654-2656.
Yoshida, S., "Electrochemical etching of a conductive GaN crystal for patterning," J. of Crystal Growth 181, 1997, pp. 293-296.
Tavernier, P.R. et al., "Mechanics of laser-assisted debonding of films," J. of Appl. Phys. 89(3), pp. 1527-1536 (2001).
Wierer, J.J., et al., "High-power AlGaInN flip-chip light-emitting diodes," Appl. Phys. Lett. 78(22), pp. 3379-3381 (2001).
Wong, W.S. et al., "Damage-free separation of GaN thin films from sapphire substrates," Appl. Phy. Lett. 72(5), pp. 599-601 (1998).
Wong, W.S. et al., "Fabrication of thin-film InGaN light-emitting diode membranes by laser lift-off," Appl. Phys. Lett. 75(10), pp. 1360-1362 (1999).
Wong, W.S. et al., "$InxGa1-xN$ light emitting diodes on Si substrates fabricated by Pd—In metal bonding and laser lift-off," Appl. Phys. Lett. 77(18), pp. 2822-2824 (2000).
Youtsey, C., "Gallium nitride whiskers formed by selective photoenhanced wet etching of dislocations," Appl. Phys. Lett. 73(6), pp. 797-799 (1998).
Japanese Office Action (with English translation) dated May 28, 2005 for Japanese Patent Application No. 2011-013852.
European Office Action dated Jun. 14, 2013 for European Patent Application No. 11154566.1.
Japanese Office Action (with English translation) dated Jun. 3, 2014 for Japanese Patent Application No. 2005-512858.
Japanese Office Action (with English translation) dated Jun. 10, 2014 for Japanese Patent Application No. 2011-013852.
Stutzmann, M., et al., "Playing with Polarity", Phys. Stat. Sol (b), 2001, pp. 505-512, vol. 228, No. 2.
Tavernier, P.R., et al., "The growth of N-face GaN by MOCVD: effect of Mg, Si, and In", Journal of Crystal Growth, 2004, pp. 150-158, vol. 264.
English Machine Translation of JP10-233385 dated Sep. 2, 1998.
PCT International Preliminary Examination Report for PCT Application No. PCT/US2003/039211 dated Feb. 10, 2006.
EP Search Report 03819251.4 dated Mar. 20, 2008.
Nullity Action dated Mar. 14, 2018 foe DE application No. 603 41 314.5. 39 pages.
Harle et al., "Light extraction technologies for high-efficiency GaInN-LED devices". Proceedings of SPIE, vol. 4996, 2003, pp. 133-138.
"Evolutionary new chip design targets lighting systems". Technology LEDs, compoundsemiconductor.net Mar. 2007 Compound Semiconductor, pp. 14-16.
Hellman, E.S., "The Polarity of GaN: a Critical Review", MRS Internet J. Nitride Semicond. Res, 1998, pp. 1-11, vol. 3 No. 11.
Düsseldorf Regional Court, In the Name of the People—Judgment dated Nov. 12, 2018 (English Translation).

* cited by examiner

HIGHLY EFFICIENT GALLIUM NITRIDE BASED LIGHT EMITTING DIODES VIA SURFACE ROUGHENING

CROSS-REFERENCE TO RELATED APPLICATIONS

This application is a continuation under 35 U.S.C. Section 120 of the following co-pending and commonly-assigned application:

U.S. Utility application Ser. No. 12/576,122, filed on Oct. 8, 2009, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING", now U.S. Pat. No. 8,766,296, issued Jul. 1, 2014, which application is a continuation under 35 U.S.C Section 120 of the following co-pending and commonly-assigned application:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING", now U.S. Pat. No. 7,704,763, issued Apr. 27, 2010, which application claims the benefit under 35 U.S.C Section 365(c) of the following co-pending and commonly-assigned application:

PCT Application Ser. No. US2003/039211, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING";

all of which applications are incorporated by reference herein.

FIELD OF THE INVENTION

The invention is related to light emitting diodes, and more particularly, to highly efficient gallium nitride based light emitting diodes via surface roughening.

DESCRIPTION OF THE RELATED ART (Note: This application references a number of different publications as indicated throughout the specification by one or more reference numbers. A list of these different publications ordered according to these reference numbers can be found below in the section entitled "References." Each of these publications is incorporated by reference herein.)

Gallium nitride (GaN) based wide band gap semiconductor light emitting diodes (LEDs) have been available for about 10 years. The progress of LED development has brought about great changes in LED technology, with the realization of full-color LED displays, LED traffic signals, white LEDs and so on Recently, high-efficiency white LEDs have gained much interest as possible replacements for fluorescent lamps. Specifically, the efficiency of white LEDs (74 lm/W) [1] is approaching that of ordinary fluorescent lamps (75 lm/W). Nonetheless, more improvement in efficiency is desirable.

There are two principle approaches for improving LED efficiency. The first approach is increasing the internal quantum efficiency ($\eta_i$), which is determined by crystal quality and epitaxial layer structure, while the second approach is increasing the light extraction efficiency ($\theta_{extraction}$).

Increasing the internal quantum efficiency cannot readily be done. A typical $\theta_i$ value for blue LEDs is more than 70% [2] and an ultraviolet (UV) LED grown on a low-dislocation GaN substrate has recently exhibited an $\theta_i$ of about 80% [3]. There is little room for improvement of these values.

On the other hand, there is plenty of room for improving the light extraction efficiency. A number of issues may be addressed in eliminating the internal loss of light, including: high reflective mirror, low reflection surface such as roughened surface, highly thermal dispersion structure, etc.

For example, considering the refractive indices of GaN (n≈2.5) [4] and air, the critical angle for the light escape cone is about 23°. Assuming that light emitted from sidewalls and the backside is neglected, it is expected that approximately only 4% of the internal light can be extracted. The light outside the escape cone is reflected into the substrate and is reflected repeatedly or absorbed by active layers or electrodes, unless it escapes through the sidewalls.

The LED structure affects how much light is emitted. The impact of LED structure on light extraction efficiency is best described by example. The following examples describe several types of LED structures.

FIG. 1 is a schematic cross-section of a conventional LED structure, which includes a p-type pad electrode 10, semi-transparent electrode 12, p-type layer 14, active region 16, n-type layer 18, n-type electrode 20, and substrate 22. Because GaN is usually grown on an insulator substrate, such as sapphire, p-type and n-type electrodes 10, 20 need to be fabricated on the same plane and the resulting device structure of the electrodes 10, 20 imposes a lateral current flow. Due to the high resistivity of p-type GaN, a thin metal film is employed as a semitransparent electrode 12 for current spreading on the p-type GaN. It is desirable that the transparency of the semitransparent electrode 12 should be 100%; however, its' value for the thin metal electrodes used in GaN based LEDs is 70% at most. Moreover, the pad electrode 10 should be formed for wire bonding, which obscures the light emitted from the inside of the LED; consequently, the extraction efficiency is expected to be quite low.

FIG. 2 is a schematic cross-section of a flip-chip type LED structure, which includes a transparent sapphire substrate 24, n-type layer 26, n-type electrode 28, active region 30, p-type layer 32, p-type electrode 34, solder 36, and host submount 38. In order to improve the external efficiency, light can be extracted though the transparent sapphire substrate 24 of the flip-chip type LED structure. This method has an advantage over conventional LEDs with respect to a reduction of the light absorption by the thin metal film and the pad electrode. However, most of the light emitted from the active region would be reflected at the interface between the substrate 24 and n-type layer 26, and the interface between the substrate 24 and the air.

A method that allows for GaN film detachment from a sapphire substrate is called "laser lift off" (LLO) technique. By applying this method to flip-chip type GaN based LEDs, sapphire substrate-free GaN LEDs can be realized. Assuming that the resulting GaN surface is worked into a non-planar orientation, a significant improvement of the extraction efficiency is expected.

Another approach to increasing extraction efficiency is to roughen the LED's surface [5], which discourages internal light reflection and scatters the light upward. However, surface roughened LEDs have been mentioned only in the context of the gallium phosphide (GaP) family of materials, because GaN is very durable material and an ordinary wet etching method does not have much effect. Thus, although the idea of roughening the semiconductor surface for the sake of scattering light was first considered in the 1970's, it has been believed to be difficult and costly for this kind of LED structure to be produced.

However, as noted above, typical GaN-based LEDs are comprised of a thin p-GaN/active layer/n-GaN film on a sapphire or silicon carbide (SiC) substrate.

Although producing a roughened surface requires a certain GaN layer thickness [6], growing thick p-GaN is not desirable due to the relatively high resistivity of p-GaN, which demands a semi-transparency contact on the p-GaN surface if the light is extracted through the p-GaN, and some treatments such as dry etching [7] for roughening surfaces might cause electrical deterioration. Growing a p-side down structure by metalorganic chemical vapor deposition (MOCVD) is also undesirable, because of the magnesium (Mg) memory effect [8], which deteriorates the active layer.

Recently, a laser lift off (LLO) method has been used to detach a sapphire substrate from a GaN film grown on the substrate [9-11]. Further, LLO has been used to fabricate GaN-based LEDs [12, 13]. However, there was no reference to the effect of this technique on surface morphology or extraction efficiency.

On the other hand, in the present invention, utilizing flip-chip technology [14] and the LLO method, a substrate-free nitrogen (N) side-up GaN-based LED structure can be made. Thereafter, an anisotropic etching process can be used to roughen the surface of the N-side-up GaN-based LED. This results in a hexagonal "cone-like" surface, which is beneficial for light extraction. Extraction efficiency of an optimally roughened surface LED shows an increase by more than 100% compared to an LED before roughening.

Note that, for some time, GaN has been believed to be difficult to anisotropically etch. This is true because GaN is a chemically stable material compared with other semiconductor materials. The use of dry etching to make a textured surface is possible, but requires extra processing, such as photolithography, and it is impossible to make a fine cone-like surface on the GaN.

When photo-enhanced chemical (PEC) etching is used on gallium face (Ga-face) GaN, small pits are formed on the surface. This is in contrast to PEC etching of nitrogen face (N-face) GaN, which results in distinct cone-like features. Although there are a few reports dealing with GaN-based LEDs fabricated using the LLO technique, the present invention fabricates cone-like structures on the N-face GaN surface of the GaN based LED using an anisotropic etching method.

SUMMARY OF THE INVENTION

The present invention describes a gallium nitride (GaN) based light emitting diode (LED), wherein light is extracted through a nitrogen face (N-face) of the LED and a surface of the N-face is roughened into one or more hexagonal shaped cones. The roughened surface reduces light reflections occurring repeatedly inside the LED, and thus extracts more light out of the LED.

The surface of the N-face is roughened by an anisotropic etching. The anisotropic etching may comprise a dry etching or a photo-enhanced chemical (PEC) etching.

In one embodiment, the N-face GaN is prepared by a laser lift off (LLO) technique. In another embodiment, the LED is grown on a c-plane GaN wafer, a p-type layer's surface is a gallium face (Ga-face), and the n-type layer's surface is a nitrogen face (N-face).

BRIEF DESCRIPTION OF THE DRAWINGS

Referring now to the drawings in which like reference numbers represent corresponding parts throughout:

FIG. 6(a) shows an LED with a current-blocking layer, while FIG. 6(b) shows an LED with a current-confining frame;

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a means of increasing the extraction efficiency by roughening the surface of GaN based LEDs. Specifically, applying an anisotropic PEC etching method to an N-face c-plane GaN surface results in the fabrication of cone-shaped surface features. This roughened surface reduces light reflections occurring repeatedly inside the LED, and thus extracts more light out of the LED. Moreover, the method of the present invention is simple, repeatable and should not damage the material, in contrast to other methods of surface roughening that may compromise the material's quality, all of which renders the present invention more suitable for manufacturing LEDs.

LED Structure

Figure 1:
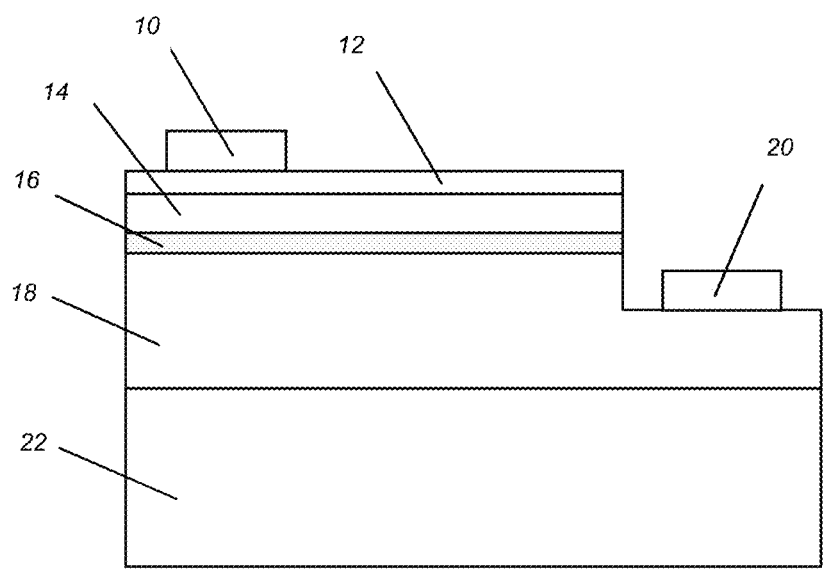
FIG. 1 is a schematic cross-section of a conventional LED structure.
Figure 2:
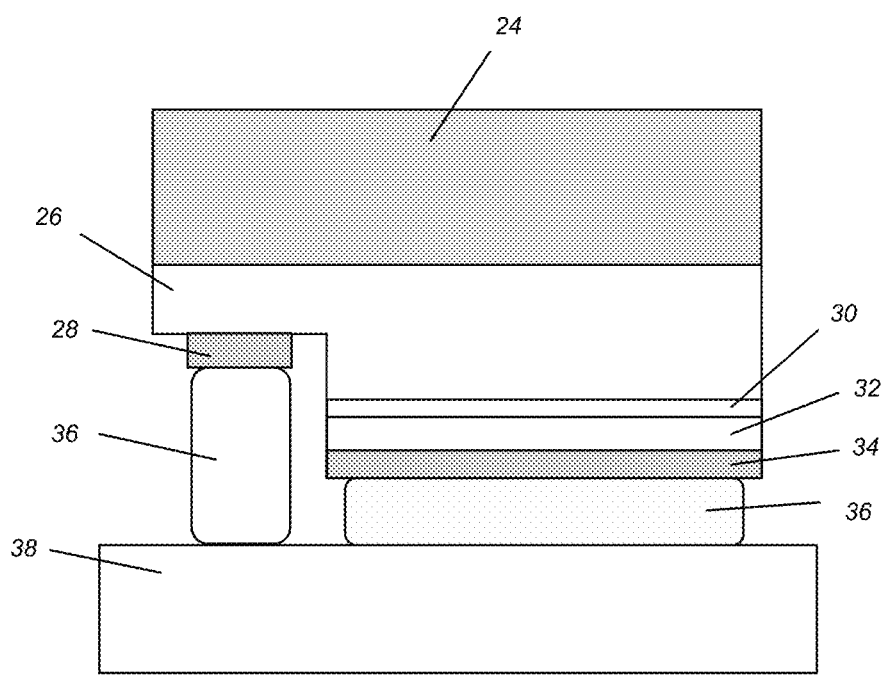
FIG. 2 is a schematic cross-section of a flip-chip type LED structure.
Figure 3:
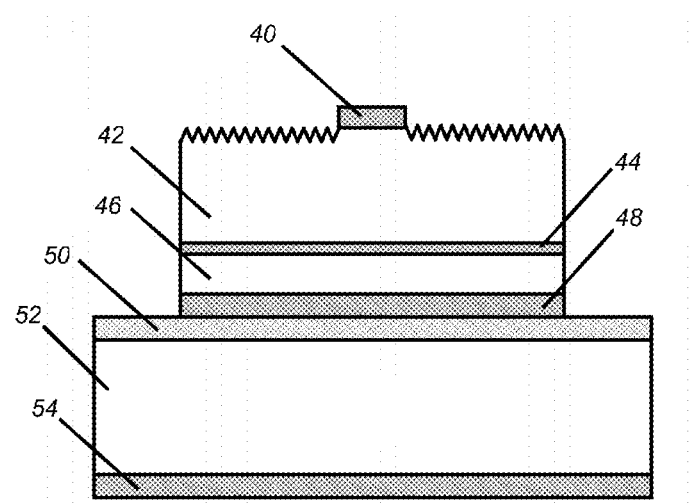
FIG. 3 is a schematic of a surface roughened LED.

FIG. 3 is a schematic of a surface roughened LED, which includes an n-type electrode 40, n-type layer 42, active region 44, p-type layer 46 and p-type electrode 48 which has been flip-chip bonded via a solder layer 50 to a silicon (Si) submount 52 that includes an n-type electrode 54. The n-type layer 42, active region 44 and p-type layer 46 are comprised of a (B, Al, Ga, In)N alloy. A dry or PEC etching method is used to roughen the surface of the n-type layer 42. Appropriate conditions, such as plasma chemistries and plasma power for dry etching, and electrolytes and lamp power for PEC etching, need to be set so that a desirable surface can be obtained. It is important that this GaN based LED should be grown along its c-axis and this n-type GaN surface should be N-face because anisotropic etching can be observed on N-face GaN much more readily than Ga-face GaN.

Note that c-plane GaN is the structure where the plane that contains only Ga atoms and the plane that contains only N atoms are piled or stacked up alternately. If one surface is Ga-face, then the opposing surface is N-face. Due to the fact that Ga-face c-plane GaN is generally preferred from the point of view of crystal growth and device performance, N-face GaN needs to be prepared by the LLO technique, or alternatively, the LED structure could be grown on the c-plane bulk GaN wafer.

The light emitted from the active region 44 toward the roughened n-type GaN surface 42 is scattered by the surface, which does not reflect the light back to the active region. It is desired that the p-type electrode 48 have a property of high reflection to decrease light absorption and to increase light reflection toward the n-type GaN surface 42. In experimental results, it has been determined that the present invention increases the upward light output power for the LED with a roughened surface two or three times as compared with an LED with a flat surface.

Processing Steps

Figure 4:
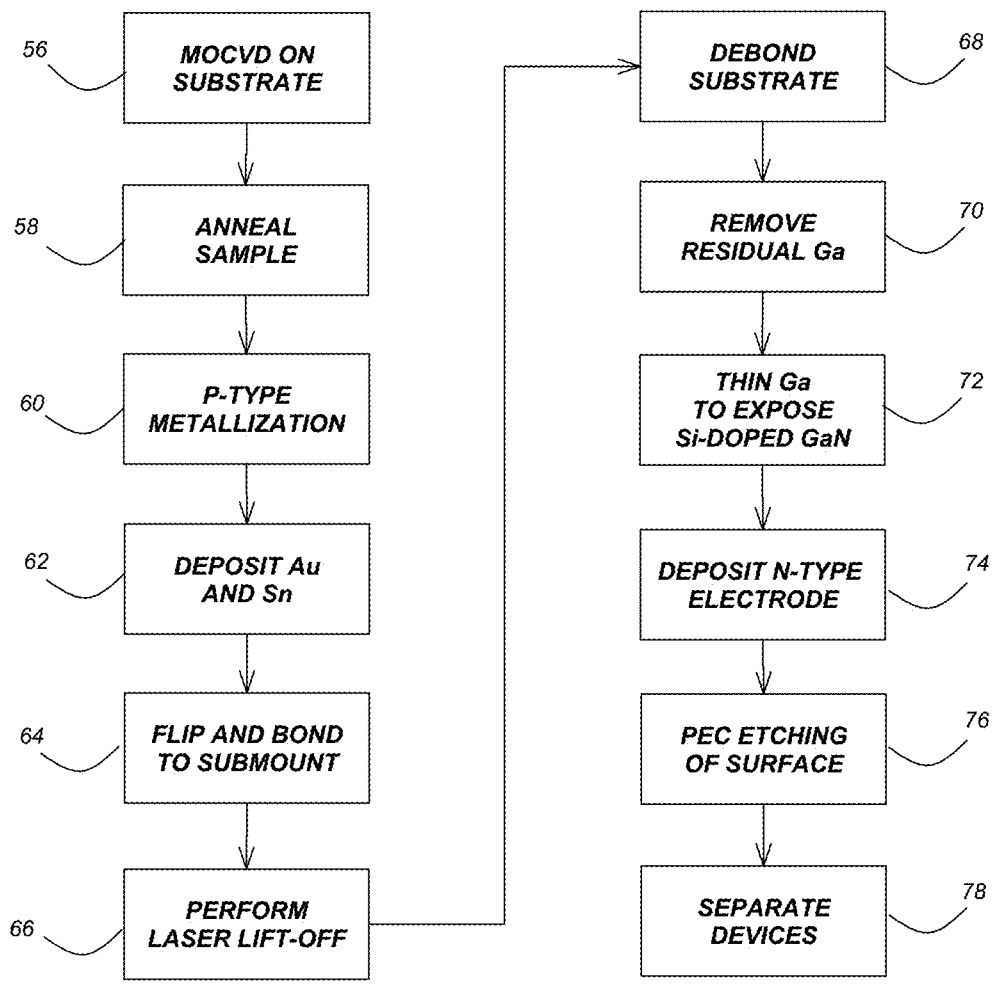
FIG. 4 is a flowchart that illustrates the processing steps used in the preferred embodiment of the present invention.

FIG. 4 is a flowchart that illustrates the processing steps used in the preferred embodiment of the present invention.

Block 56 represents the step of growing Ga-face epitaxial layers on a c-plane sapphire substrate by MOCVD, thereby creating a sample.

Block 58 represents the step of annealing the sample for p-type activation, after the MOCVD.

Block 60 represents the step of performing a p-type metallization process on the sample, including, but not limited to, silver (Ag) or aluminum (Al), to create a highly reflective p-GaN contact.

Block 62 represents the step of depositing thick gold (Au) layers on the sample, followed by tin (Sn) layers as a solder metal by Sn evaporation in a thermal evaporator.

Block 64 represents the step of flipping the sample and bonding it to an Au-coated Si substrate/submount at a temperature above 280° C., wherein an Au/Sn alloy forms that contributions to the adhesion of the sample to the Si substrate.

Block 66 represents the step of performing an LLO process by irradiating the transparent sapphire substrate of the sample using a krypton fluoride (KrF) eximer laser light (248 nm) through the backside of the sapphire substrate, resulting in local decomposition of the GaN at the GaN/sapphire substrate interface. Specifically, by rastering the KrF eximer laser spot over the sample, the GaN-based LED membrane is transferred to the Si substrate/submount.

Block 68 represents the step of debonding the sapphire substrate from the sample, after rastering the KrF laser over the sample.

Block 70 represents the step of removing any residual Ga droplets on the detached GaN surface of the sample using an hydrochloride (HCl) solution.

Block 72 represents the step of thinning the transferred GaN until the Si-doped N-face GaN is exposed on the sample.

Block 74 represents the step of depositing a titanium/aluminum/titanium/gold (Ti/Al/Ti/Au) electrode as an n-type contact or electrode on the exposed N-face GaN of the sample.

Block 76 represents the step of PEC etching by immersing the sample in an electrolyte solution of potassium hydroxide (KOH) and irradiating the N-face GaN surface using a xenon/mercury (Xe/Hg) lamp, in such a way that the top surface is roughened. The details of PEC etching are described in [15].

Block 78 represents the step of separating each device on the Si substrate of the sample using a dry etching, dicing or cleaving method.

Figure 5:
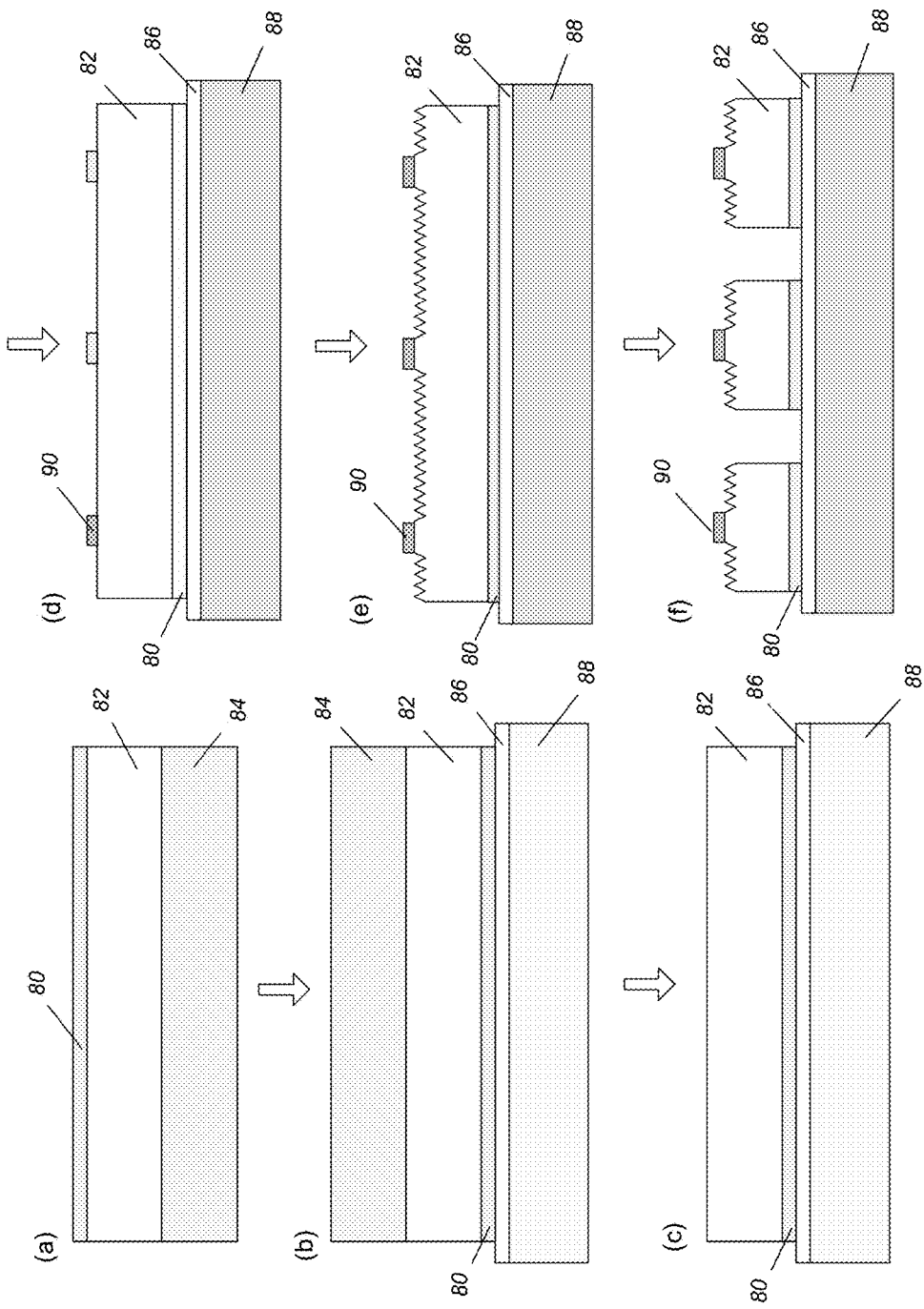
FIGS. 5(a)-(f) further illustrate the fabrication steps for the LEDs with surface roughening.

FIGS. 5(a)-(f) further illustrate the fabrication steps for the LEDs with surface roughening, wherein the LED structure includes a p-type electrode 80, GaN-based LED membrane 82, sapphire substrate 84, solder metal 86, submount (carrier) 88 and n-type electrode 90. Specifically, FIG. 5(a) shows the results after the p-type electrode 80 deposition, FIG. 5(b) shows the results after the LED is bonded onto the host submount 88, FIG. 5(c) shows the results after the sapphire substrate 84 removal by LLO, FIG. 5(d) shows the results after n-type electrode 90 deposition, FIG. 5(e) shows the results after the roughening of the GaN surface 82, and FIG. 5(f) shows the results after device isolation.

Possible Modifications

Although a basic structure has been described above, a number of modifications and variations are possible.

Figure 6:
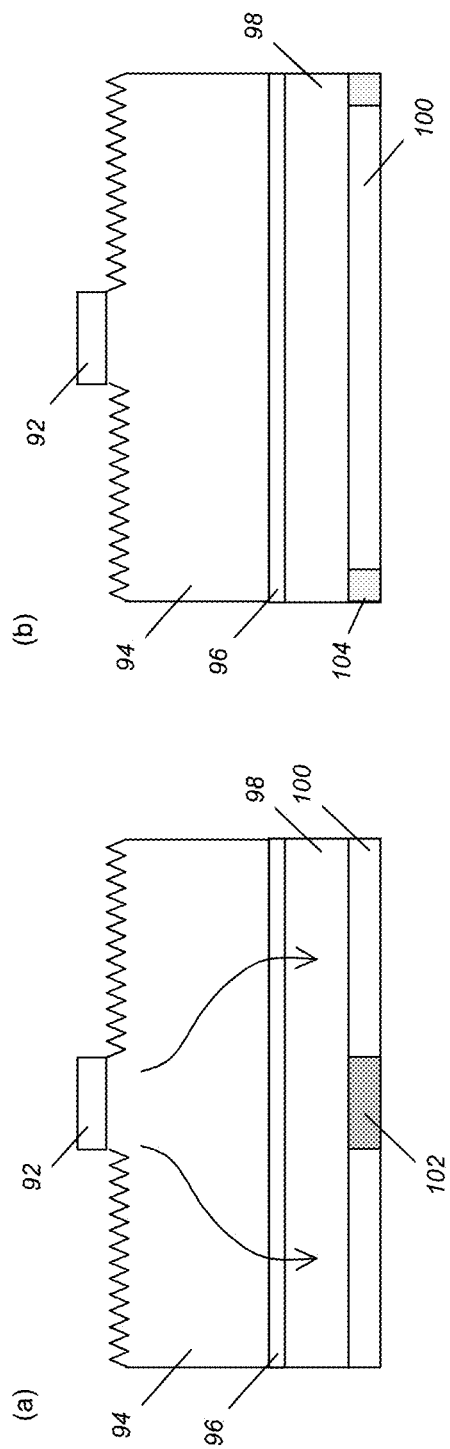

FIG. 6(a) shows an LED with a current-blocking layer, while FIG. 6(b) shows an LED with a current-confining frame, wherein the LEDs include an n-type electrode 92, n-type layer 94, active layer 96, p-type layer 98, p-type electrode 100, current-blocking layer 102, and current confining frame 104.

In FIG. 6(a), the LED has a current-blocking layer 102 aligned under the n-type electrode 92. This current-blocking layer 102 keeps the current from concentrating below the n-type electrode 92 so that absorption of light emission under the electrode 92 can be avoided and the extraction efficiency can be increased. It is suitable that an insulator such as $SiO_2$ is located on the p-GaN layer 98 because the current spreading hardly occurs in the resistive p-GaN layer 98.

In FIG. 6(b), the LED has a current-confining frame 104 made of an insulator. If a dry-etching or a dicing method is used to separate the devices, the sidewalls of the devices might conduct a leakage current, if the surfaces are damaged. Such leakage current decreases both the efficiency and lifetime of the LED. The current-confinement frame 104 contributes to the restraint of leakage current through the sidewalls of the LED and does not significantly decrease the emitting area, if the width of the frame is chosen appropriately.

Although an Si substrate has been described as a host submount in the LLO process, alternative substrate materials may be used to practice this invention. Although Si is cheaper and has a higher thermal conductivity than sapphire, other substrates, such as SiC, diamond, AlN, or various metals such as CuW, may be fit for use from the point of view of thermal conductivity.

At present, GaN devices can be also grown directly on SiC and Si substrate. If a GaN-based LED is grown on SiC or Si, conventional dry etching or wet etching can remove the substrate. By utilizing a bulk GaN substrate, the LLO process can be eliminated.

Sample size is also an important point for LED fabrication. Nowadays, LEDs with a large size are attracting attention to meet demand for high-power LEDs. Even though the resistivity of the n-type GaN is lower than that of p-GaN, the size affects the n-type electrode geometry for the purpose of current spreading.

Experimental Results

In experiments performed by the inventors, Ga-face epitaxial layers were grown on a c-plane sapphire substrate by MOCVD. The structure was comprised of 4 μm-thick undoped and Si-doped GaN layers, a 5-period GaN/InGaN multi-quantum-well (MQW), a 20 nm-thick Mg-doped $Al_{0.2}Ga_{0.8}N$ layer, and 0.3 μm-thick Mg-doped GaN. After MOCVD, the sample was annealed for p-type activation and then a p-type metallization process was performed. An Ag-based electrode was adopted as a highly reflective p-GaN contact. Thick Au was deposited on the sample followed by Sn evaporation in a thermal evaporator. The wafer was flipped and bonded to an Au-coated Si submount at a temperature of 280° C., resulting in an alloy of Au and Sn, which contributes to firm adhesion of the wafer to the submount. A KrF laser (248 nm) was used for the LLO process, in which the laser was shone through the transparent sapphire substrate, causing local decomposition of GaN at the boundary between GaN and sapphire. After rastering the KrF laser over the sample, the sapphire substrate was debonded. The remaining Ga droplets on the transferred GaN surface were removed by an HCl solution. Next, the transferred GaN was thinned until the Si-doped GaN was exposed. An n-contact was formed on the exposed N-face n-GaN and each device was divided from its neighbors by reactive ion etching (RIE). Finally, in order to roughen the top of surface, PEC etching was used. A KOH solution and Xe/Hg lamp were used as electrolyte and light source, respectively. The output power of the LED was measured with an Si-detector set at a height of 7 mm over the LED chips.

Figure 7:
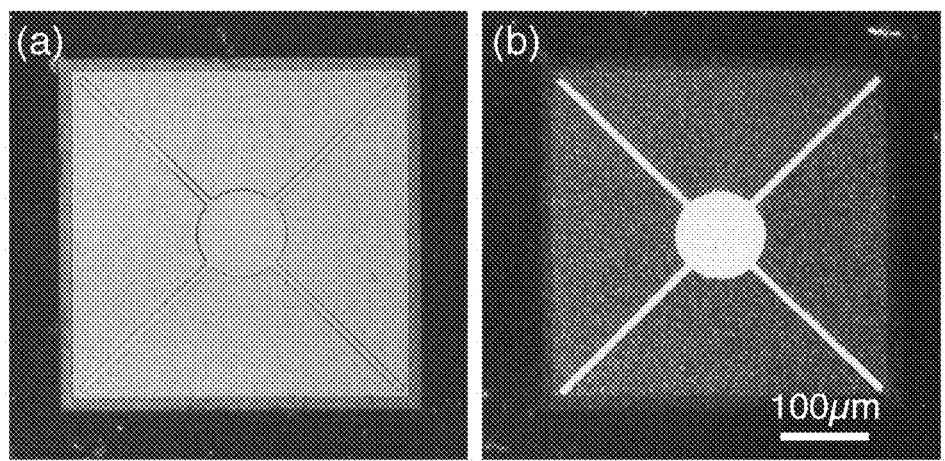
FIGS. 7(a) and 7(b) are plan-view micrographs of an LLO-LED with a cross-shaped n-electrode.

FIGS. 7(a) and 7(b) are plan-view micrographs of an LLO-LED with a cross-shaped n-electrode, wherein the LED is bonded on an Si substrate. FIG. 7(a) shows the surface before roughening and FIG. 7(b) shows the surface after roughening. Because the n-electrode blocks UV light during PEC etching, the GaN beneath it is not etched and the electrode remains on the GaN after roughening. A transparent electrode such as indium tin oxide (ITO) can be employed as a current spreading electrode.

Figure 8:
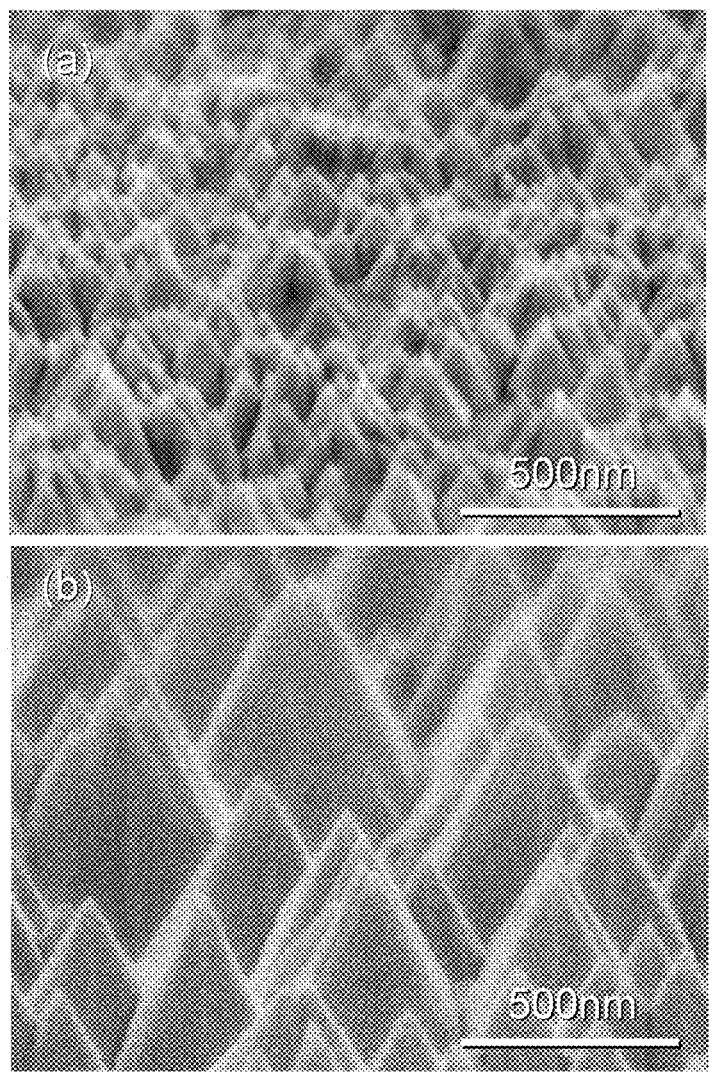
FIGS. 8(a) and 8(b) are scanning electron micrograph (SEM) images of the N-face of GaN after PEC etching for different etching times.

FIGS. 8(a) and 8(b) are scanning electron micrograph (SEM) images of the N-face of GaN after PEC etching for different etching times. Notice that the PEC-etched N-face GaN surfaces include a plurality of hexagonal shaped cones, which are distinct from the PEC-etched GaN surfaces reported by Youtsey, et al. [16]. This difference is considered to be due to the surface polarity of GaN. In comparing the 2 minute (min) etched surface of FIG. 8(a) and the 10 min etched surface of FIG. 8(b), the size of the features increases and the facets of the hexagonal cones become more defined.

The cone-shaped surface appears very effective for light extraction from the LED. Moreover, experimental results suggest that a cone shape can extract more light. For example, the wavelength of a blue LED in a GaN crystal is about 200 nm. If the size of the cone shape is much smaller than that value, then the light might not be affected by the roughness. On the other hand, if the size of the cone shape is close to that value, the light might be scattered or diffracted.

In experimental results, it has been determined that the roughened surface is comprised of many hexagonal shaped cones that have an angle equal to or smaller than:

$$2 \sin^{-1}(n_{air}/n_s) \approx 47.2°$$

for GaN, where $\theta_{air}$ is a refractive index of air and $n_s$ is a refractive index of GaN. Similarly, it has been determined that the roughened surface is comprised of many hexagonal shaped cones that have an angle equal to or smaller than:

$$2 \sin^{-1}(n_{enc}/n_s)$$

for epoxy, where $n_{enc}$ is a refractive index of epoxy and $n_s$ is a refractive index of GaN.

It is possible that the surface may not have to be cone shaped, and a grating structure and photonic crystal should be considered. These might be better structures for light extraction. However, the fabrication of photonic crystals requires precise design and processing, which is more costly than fabricating a cone-shaped surface roughness.

The "mirror-like" surface before PEC etching becomes discolored as the etching time increases. If a highly reflective metal is deposited on the other side of GaN film, the surface appears white; otherwise, it is darker. This is believed to be due to the light-reflection restraint at the air/GaN boundary, and if there is a highly reflective metal on the backside of the GaN, the light passing into GaN comes out again, scattering at the roughened surface.

Figure 9:
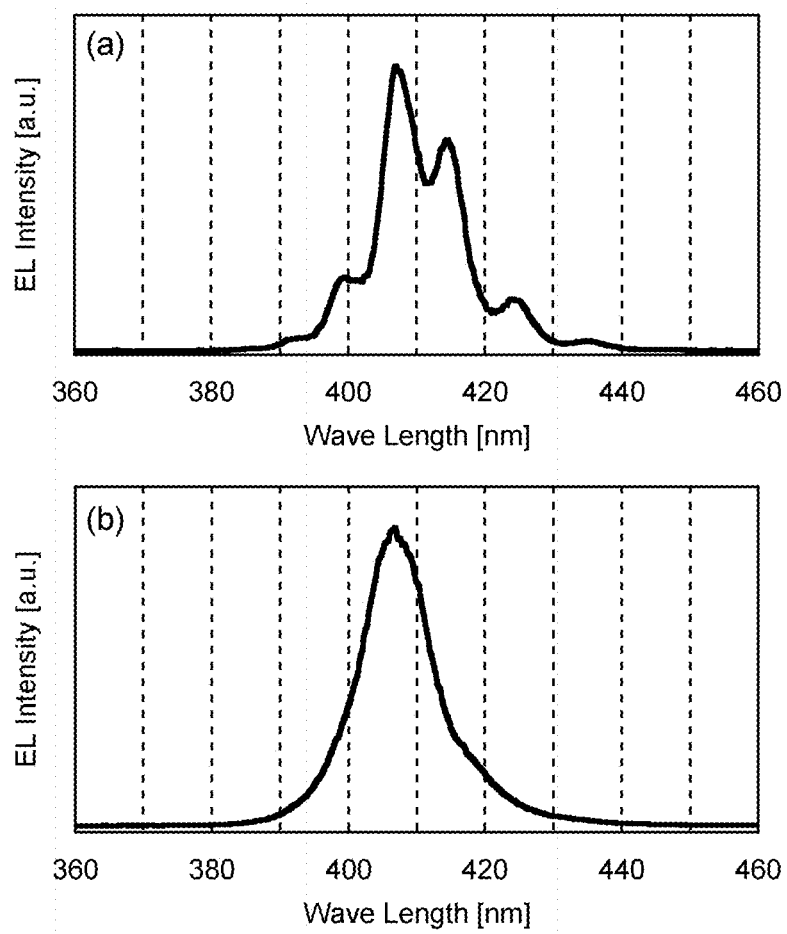
FIGS. 9(a) and 9(b) show an electroluminescence (EL) spectra from a flat-surface LED and a roughened-surface LED, respectively.

Electroluminescence (EL) spectra from a flat-surface LED and a roughened-surface LED are shown in FIGS. 9(a) and 9(b), respectively. The measurement was performed at a forward current density of 25 A/cm$^2$ DC at room temperature (RT). The spectrum of the flat-surface LED had multi-peaked emission, as shown in FIG. 9(a), suggesting that the light emitted from the active region was interfered in the vertical GaN cavity sandwiched between mirrors made of GaN/metal and GaN/air. In contrast, as shown in FIG. 9(b), no longitudinal mode was observed on the roughened surface LED. This means that the roughened GaN/air interface scattered the light, resulting in suppression of the resonance.

Figure 10:
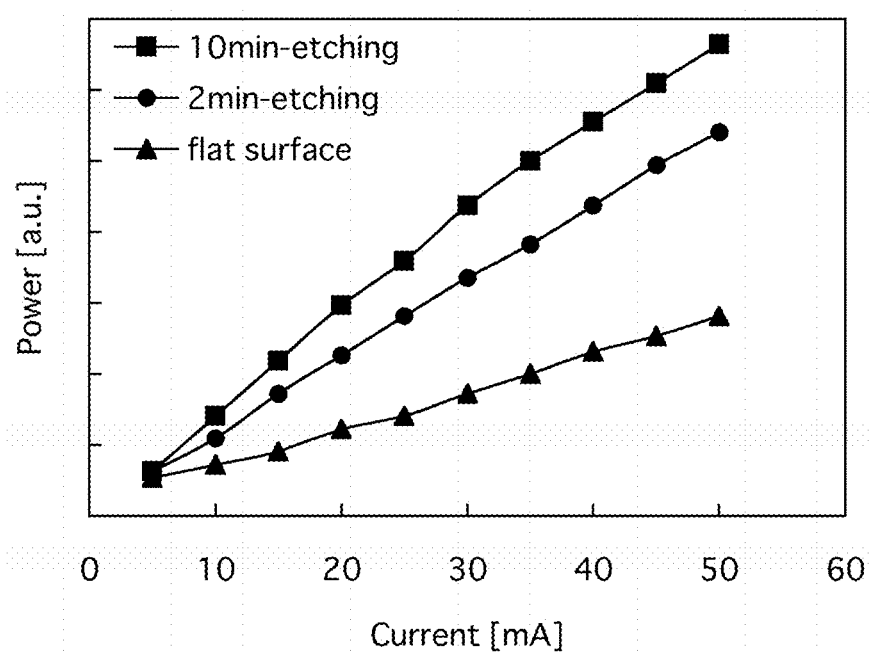
FIG. 10 is a graph of upward EL output power vs. DC injection current (L-I) characteristics for the LEDs with different etching times at room temperature.

FIG. 10 is a graph of upward EL output power vs. DC injection current (L-I) characteristics for the LEDs with different etching times at room temperature. These data were obtained from the same device before and after PEC etching, so that any factor causing this difference except the surface morphology could be neglected. Any L-I curves showed linear characteristics up to 50 mA. Because of the relatively higher thermal conductivity of Si than that of sapphire, these devices are advantageous for high power operation. The output power at a given current increased with increasing PEC etching time. As compared with the output power for a flat-surface LED and the 10 min etched surface LED, this roughening treatment resulted in an increase of output power by a factor of 2.3. From other measurements on different devices, the power also showed a two to three-fold increase after the roughening process. Because a flat-surface LED tends to emit more light from the sidewalls of the LED chip than a roughened surface LED due to the lateral propagation of light, the difference of output power would be less if the total power were measured in an integrating sphere. Nevertheless this enhancement of extraction efficiency by anisotropic etching technique shows significant improvement.

In conclusion, an anisotropic etching method has been applied to a GaN-based LED for the purpose of increasing extraction efficiency. LED output test results have indicated that, presumably due to the decrease in light propagation in the GaN film, there is a relationship between a roughened appearance and extraction efficiency. Although total integrated optical power has not been measured, the largest increase in extraction efficiency was more than 100%. It is notable that the technique described herein is simple and does not require complicated processes, which indicates that it will be suitable for manufacturing GaN based-LEDs with surface roughening.

REFERENCES

The following references are incorporated by reference herein:

1. http://www.cree.com/News/news175.asp
2. Y. Kawakami, Y. Narukawa, K. Omae, S. Fujita, and S. Nakamura, Phys. Stat. Sol. (a) 178, 331 (2000).
3. T. Nishida, H. Saito, and N. Kobayashi, Appl. Phys. Lett. 79, 711(2001).

4. A. Billeb, W. Grieshaber, D. Stocker, E. F. Schubert, R. F. Karlicek, Jr., Appl. Phys. Lett. 70, 2790 (1997).

5. A. A. Bergh, M. Hill, R. H. Saul, and S. Plains, U.S. Pat. No. 3,739,217 (1973), entitled "Surface Roughening Of Electroluminescent Diodes."

6. Chul Huh et al., Appl. Phys. Lett. 93, 9383 (2003).

7. X. A. Cao, S. J. Pearton, A. P. Zhang, G. T. Dang, F. Ren, R. J. Shul, L. Zhang, R. Hickman, and J. M. Van Hove, Appl. Phys. Lett. 75, 2569 (1999).

8. Y. Ohba and A. Hatano, J. Crystal. Growth 145, 214 (1994).

9. W. S. Wong, T. Sands, N. W. Cheung, M. Kneissl, D. P. Bour, P. Mei, L. T. Romano, and N. M. Johnson, Appl. Phys. Lett. 72, 1999 (1998).

10. P. R. Tavernier and D. R. Clarke, J. Appl. Phys. 89, 1527 (2001).

11. C. F. Chu, C. C. Yu, H. C. Cheng, C. F. Lin, and S. C. Wang, Jpn. J. Appl. Phys. 42, L147 (2003).

12. W. S. Wong, T. Sands, N. W. Cheung, M. Kneissl, D. P. Bour, P. Mei, L. T. Romano, N. M. Johnson, "Fabrication of thin-film InGaN light-emitting diode membranes by laser lift off," Appl. Phys. Lett., 75 (10) 1360 (1999).

13. W. S. Wong, T. Sands, N. W. Cheung, M. Kneissl, D. P. Bour, P. Mei, L. T. Romano, N. M. Johnson, "InXGal-XN light emitting diodes on Si substrates fabricated by Pd—In metal bonding and laser lift-off," Appl. Phys. Lett., 77 (18) 2822 (2000).

14. J. J. Wierer, D. A. Steigerwald, M. R. Krames, J. J. O'Shea, M. J. Ludowise, N. F. Gardner, R. S. Kern, and S. A. Stockman, Appl. Phys. Lett. 78, 3379 (2001).

15. M. S. Minsky, M. White, and E. L. Hu, Appl. Phys. Lett. 68, 1531 (1996).

16. C. Youtsey, L. T. Romano, and I. Adesida, Appl. Phys. Lett. 73, 797 (1998).

CONCLUSION

This concludes the description of the preferred embodiment of the present invention. The following describes some alternative embodiments for accomplishing the present invention.

A number of different growth methods other than MOCVD could be used in the present invention.

In addition, substrates other than sapphire or silicon carbide could be employed.

Also, different LED structures may be created. For example, resonant cavity LEDs (RCLEDs) or micro cavity LEDs (MCLEDs) could be created as well.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A (B, Al, Ga, In)N light emitting diode (LED), comprised of:
   a plurality of (B, Al, Ga, In)N layers including at least an active region having an emitting layer positioned between an n-type layer and a p-type layer;
   wherein light from the emitting layer is extracted through a nitrogen face (N-face) surface of the n-type layer, and the N-face surface of the n-type layer is comprised of a plurality of etched cone structures having a size not smaller than a wavelength of the light within the LED to increase extraction efficiency of the light from the emitting layer out of the N-face surface as compared to the N-face surface without the etched cone structures.

2. The LED of claim 1, wherein the etched cone structures comprise photo-enhanced chemical (PEC) etched cone structures.

3. The LED of claim 1, wherein the etched cone structures comprise hexagonal shaped cones that have an angle equal to or smaller than:

$$2 \sin^{-1}(n_{air}/n_s)$$

where $n_{air}$ is a refractive index of air and $n_s$ is a refractive index of the N-face surface.

4. The LED of claim 1, further comprising a p-type electrode on the p-type layer, wherein the p-type electrode has a property of high reflection to increase light reflection toward the N-face surface.

5. The LED of claim 1, further comprising an n-type electrode on the n-type layer, wherein a current-blocking layer is aligned under the n-type electrode to keep current from concentrating below the n-type electrode, so that absorption of the light under the n-type electrode is avoided and the extraction efficiency of the light is increased.

6. The LED of claim 1, further comprising one or more solder metals deposited on the (B, Al, Ga, In)N layers, wherein the solder metals include gold (Au) and tin (Sn).

7. A method of creating a (B, Al, Ga, In)N light emitting diode (LED), comprised of:
   fabricating a plurality of (B, Al, Ga, In)N layers including at least an active region having an emitting layer positioned between an n-type layer and a p-type layer;
   exposing a nitrogen face (N-face) surface of the n-type layer by removing a substrate, wherein light from the emitting layer is extracted through the N-face surface of the n-type layer; and
   etching the N-face surface of the n-type layer after the substrate is removed to create a plurality of etched cone structures having a size not smaller than a wavelength of the light within the LED to increase extraction efficiency of the light from the emitting layer out of the N-face surface as compared to the N-face surface without the etched cone structures.

8. A (B, Al, Ga, In)N light emitting diode (LED), comprised of:
   at least an active region having an emitting layer positioned between an n-type layer and a p-type layer, and a p-type electrode on the p-type layer;
   wherein light from the emitting layer is extracted through a nitrogen face (N-face) surface of the n-type layer and the N-face surface of the n-type layer is comprised of a plurality of etched cone structures having a size not smaller than a wavelength of the light within the LED to increase extraction efficiency of the light from the emitting layer out of the N-face surface as compared to the N-face surface without the etched cone structures; and
   wherein the p-type electrode has a property of high reflection to increase light reflection towards the N-face surface.

9. The LED of claim 8, wherein the LED is further comprised of a solder metal which comprises gold (Au).

10. The LED of claim 9, wherein the solder metal is a gold-tin (Au—Sn).

11. The LED of claim 8, wherein the LED is further comprised of an n-type electrode on the n-type layer, and a current-blocking layer is aligned under the n-type electrode to keep current from concentrating below the n-type electrode, so that absorption of the light under the n-type electrode is avoided and the extraction efficiency of the light is increased.

12. The LED of claim 8, wherein the etched cone structures comprise hexagonal shaped cones that have an angle equal to or smaller than:

$$2 \sin^{-1}(n_{air}/n_s)$$

where $n_{air}$ is a refractive index of air and $n_s$ is a refractive index of the N-face surface.

* * * * *